US008271909B2

(12) United States Patent
Majumder et al.

(10) Patent No.: US 8,271,909 B2
(45) Date of Patent: Sep. 18, 2012

(54) SYSTEM AND METHOD FOR APERTURE BASED LAYOUT DATA ANALYSIS TO ACHIEVE NEIGHBORHOOD AWARENESS

(75) Inventors: Chayan Majumder, Delhi (IN); Sandipan Ghosh, New Delhi (IN); Anil Kumar Arya, Uttar Pradesh (IN); Pawan Kumar Fangaria, Uttar Pradesh (IN); Rajan Arora, Faridabad (IN)

(73) Assignee: Cadence Design Systems, Inc., San Jose, CA (US)

( * ) Notice: Subject to any disclaimer, the term of this patent is extended or adjusted under 35 U.S.C. 154(b) by 431 days.

(21) Appl. No.: 12/366,911

(22) Filed: Feb. 6, 2009

(65) Prior Publication Data
US 2010/0205576 A1    Aug. 12, 2010

(51) Int. Cl.
*G06F 17/50*    (2006.01)
(52) U.S. Cl. ............................. 716/53; 716/104; 716/136
(58) Field of Classification Search .................... 716/53, 716/104, 139
See application file for complete search history.

(56) References Cited

U.S. PATENT DOCUMENTS

| 6,448,977 B1 * | 9/2002 | Braun et al. ................... 715/701 |
| 6,480,995 B1 | 11/2002 | Schmidt et al. |
| 6,791,548 B2 * | 9/2004 | Dutta et al. .................... 345/473 |
| 7,178,114 B2 | 2/2007 | Lin et al. |
| 7,441,220 B2 | 10/2008 | Hetzel et al. |
| 7,921,390 B2 | 4/2011 | Archambeault et al. |
| 2005/0229134 A1 | 10/2005 | Hetzel et al. |

OTHER PUBLICATIONS

Martin, "Tutorial Cadence Design Environment", New Mexico State University, Oct. 2000, pp. 1-51.

* cited by examiner

*Primary Examiner* — Thuan Do
(74) *Attorney, Agent, or Firm* — Kenyon & Kenyon LLP (57) ABSTRACT

Embodiments of the invention provide system and methods for EDA tools. Specifically, some embodiments of the invention provide an input infrastructure for EDA tools that gathers pertinent information surrounding an input cursor's present locality (or neighborhood) and then analyzes the pertinent information in view of an issued command to automatically determine suitable targets or subsequent operations that a user of the EDA tool may want to select next.

40 Claims, 9 Drawing Sheets

SYSTEM AND METHOD FOR APERTURE BASED LAYOUT DATA ANALYSIS TO ACHIEVE NEIGHBORHOOD AWARENESS

TECHNICAL FIELD

The present invention relates to designing circuits, and more particularly, some embodiments relate to tools used in designing and editing circuit layouts.

DESCRIPTION OF THE RELATED ART

Circuit designs are becoming much more complex as the world moves toward denser chips with smaller features. Accordingly, the complexity in creating circuit designs has as increased as well. In an effort to better deal with the difficulties in design, circuit designers utilize Electronic Design Automation ("EDA") tools during the circuit design phase. EDA tools, also referred to as electronic computer-aided design ("ECAD") tools, reduce a circuit designer's effort in designing and editing circuit layouts. Typically, EDA tools are a circuit design integrated design environment ("IDE") that have a graphical user interface ("GUI"). The graphical user interface allows a circuit designer to create a circuit layout visually and interactively, by making commands and inputs through the tool's GUI. With a GUI, a designer can easily issue commands to the EDA tool and effortlessly edit features and components of a circuit layout on a schematic canvas. Usually, the features and components appear as various shapes, polygons, and wires on the schematic canvas. The shapes, polygons, and wires specifically represent the features and components of the displayed circuit layout.

In addition to creating and editing features and components of a circuit, EDA tools are capable of applying process rules and process rule overrides to the overall layout of a circuit design. Process rules and process rule overrides guide how polygon shapes and wires between components of the circuit layout are drawn (such as minimum width, spacing, symmetry, alignment, etc) or are allowed to be drawn. Generally, both the rules and rule overrides provide the constraints of the technology chosen to manufacture a given circuit design. The rules and rule overrides are usually stored in a technology database that is accessible by EDA tools, and are traditionally applied to design objects in a specific hierarchical order: the design object's rules, the rules from the design containing the design object, and then the rules from the technology for which the design is made. When an additional process rule is applied to a design object, it is usually referred to as a process rule override since it overrides the hierarchy of rules that already apply to the design object.

Typically, when a circuit designer is working in an EDA tool, he or she uses layout commands to modify the circuit design. These layout commands, some of which are context-sensitive (also referred to as an interactive commands), do not anticipate the circuit designer's intentions. Generally, conventional EDA tool commands are not concerned with where on the schematic canvas they are executed. In addition, most conventional EDA tool commands fail in assisting the designer intelligently with automatic operations or suggestions for what the next possible step for the command may be.

For instance, upon execution of a context-sensitive command in an EDA tool, the circuit designer is usually required to visually inspect the area on the schematic canvas around current position of the tool's input cursor (e.g. mouse cursor) to determine what the next step for the context-sensitive command could be. In particular, the visual inspection allows the circuit designer to gather pertinent information about the area that will assist the designer in making their next step with regard to the context-sensitive command.

Consider a traditionally non-context-sensitive command, such as the move command, where a circuit object is moved from one location to another within the design. Once a designer has selected an object to move and reference point on the object is selected through the input cursor, the object visually shows as a ghost until the designer identifies a destination point for the object. However, in seeking a destination point, the designer must inspect the schematic canvas and gather pertinent information to find a desirable destination point.

The difficulty with such traditionally non-context-sensitive commands, such as the move command, arises when they are used in a more context-sensitive manner. For instance, this can occur when a designer wants to move a circuit object close to another object on the same layer such that the edges of the two objects are spaced at some set value. With conventional methods using the traditional move command, the designer would still select the object, select a reference point on the object, and then, start moving the object to the destination point. However, the designer would also have to zoom into the area to make the edges of the objects sufficiently legible for proper spacing of the objects at a desired value. In such instances, the EDA tool fails to automate steps (e.g. zooming into the area) that would alleviate some of the work a circuit designer must perform when using an EDA tool to create and modify a circuit design.

BRIEF SUMMARY OF EMBODIMENTS OF THE INVENTION

Embodiments of the invention provide systems and methods relating to analyzing layout data to achieve neighborhood awareness within an EDA tool for inputs and commands. Embodiments of the invention provide systems and methods that analyze layout data and command execution within an EDA tool in order to recognize a circuit designer's intent and either automatically execute or automatically suggest suitable targets or subsequent operations. In doing so, such embodiments can be configured to provide an EDA tool with command intelligence, "high-altitude" layout editing capabilities, and support for context-sensitive commands.

Specifically, some embodiments of the invention provide an input infrastructure for EDA tools that gathers pertinent information surrounding an input cursor's present locality (or neighborhood), and analyzes the pertinent information in view of an issued command to determine or predict suitable targets or operations that a user of the EDA tool may want select next. In other words, according to one embodiment of the invention, the input infrastructure has an input cursor, accepts commands, and is configured to collect information on the neighborhood of the input cursor. The information can be collected so that when the command calls for a context sensitive decision, the information allows the command to provide the user of the EDA tool with suggestions or previews as to the next suitable target or operation. For example, within the context of some embodiments of the invention, making a context sensitive decision can include looking for only nearby edges or looking for only nearby objects on a particular layer of the circuit design. For instance, a context-sensitive command that deals with the edges of objects can be provided with a list of all the edges on the schematic canvas closest to the current location of the mouse cursor, thereby allowing the command to snap to the nearest edge or highlight it for the user to decide.

Accordingly, some embodiments of the invention provide a method for a circuit design graphical editor comprising detecting an executed command; defining an aperture or predefined area around an input cursor (e.g. mouse cursor); collecting a neighborhood dataset from objects and object features within the aperture; determining one or more suitable targets selected from the neighborhood dataset; and presenting the suitable targets through a visual feedback. Examples of the executed command include, but are not limited to, creating rectangles, conics, and wires; bus commands; move, copy, and paste commands; stretch commands; and align commands. Those skilled in the art would appreciate that a variety of context-sensitive commands would be compatible with embodiments of the invention. In certain embodiments, if there is more than one suitable target determined, a single suitable target presented at a time.

In further embodiments, objects and object features within the aperture include shapes, edges, vertices, midpoints, object ends, nexuses and centerlines. In other embodiments, the method further comprises of sorting the order and precedence of the neighborhood dataset based on the relevancy to the executed command. In yet other embodiments, the collection of neighborhood data is based on relevancy to the executed command.

In determining the suitable targets, some embodiments base the determination on the executed command, on one or more inputs made since the invocation of the executed command, on the circuit layout topology, on the position and movement of the input cursor, or on a combination thereof.

Other embodiments of the invention provide a method for a circuit design graphical editor comprising collecting a visual data into a dataset from the graphical editor. The visual dataset comprises a visual representation of a circuit layout design. The method then captures a command issued through the graphical editor. In accordance with certain embodiments of the invention, the commands are context-sensitive commands that base their operation on the context in which they are issued.

Next, the method collects neighborhood dataset from the visual dataset and an input cursor dataset. The input cursor dataset comprises position and movement of the input cursor. In some embodiments, the neighborhood dataset comprises data regarding object features in proximity to the input cursor. Particularly, in some embodiments, the objects and object features include shapes, edges, vertices, midpoints, nexuses, and or centerlines. There are also some embodiments wherein the neighborhood dataset is cached as it is received.

The method subsequently determines a suggested next target or operation in light of the command dataset and the neighborhood dataset. There are also some embodiments wherein the suggested next target or operation is determined based on a process rule or a process rule override. Upon determining a suggested next target or operation, the method modifies the visual dataset such that the visual representation displays the circuit layout design in view of the suggested next target or operation.

In some embodiments, modifying the visual dataset results in the visual representation displaying a preview of the suggested next target or operation. In other embodiments, the suggested next target or operation is displayed through visual cues (also known as a visual feedback). For example, an embodiment of the invention can provide a visual cue to the circuit designer about what the system determines is a possible target for a command currently being performed based on the current context of the circuit design. The visual cue in such an example may comprise highlighting the possible target or providing some form of visual indicator over the possible target. In another example, while using a ruler command to draw a ruler, if a circuit designer is trying to measure distances between two edges, then the invention can highlight the nearest edge to the mouse cursor.

In further embodiments, the suggested next target or operation provides a possible target based on the possible target's proximity to the input cursor. The possible target includes an object or object feature of the circuit design that is present on the schematic canvas. In certain embodiments, when more than one possible target is provided by the suggested next target or operation, a command to cycle through a plurality of possible targets is provided. In some such embodiments, the current selected target from the plurality of possible targets is highlighted as the command to cycle is issued. In other embodiments, the plurality of possible targets is sorted based on neighborhood dataset, the command dataset, or both the neighborhood dataset and the command dataset.

In certain embodiments of the invention, a computer program product is provided, comprising a computer useable medium having computer program code embodied therein for enabling a computing device to perform operation in accordance with some of the methods of the invention.

In another embodiment of the invention, a computer aided design tool is provided, comprising a processor and memory. The memory is coupled to the processor and has computer program code embodied within it, thereby enabling the processor to perform operations in accordance with some of the methods of the invention.

In yet other embodiments, a computer aided design tool system for circuit design is provided, comprising a scanner component, a zone query component, and a graphical editor component. The graphical editor component modifies a circuit layout represented by a circuit layout dataset, handles visualization of a circuit layout and an input cursor, and accepts a user input selection and a context-sensitive command through a graphical user interface comprising an input cursor. The zone query component provides neighborhood data based on a nearest objects and object features relative to the current position of the input cursor. The scanner component collects the neighborhood data and determines a suggested next target or operation based on the neighborhood data, the context-sensitive command, and information regarding the input cursor.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

DETAILED DESCRIPTION OF THE EMBODIMENTS OF THE INVENTION

The present invention is directed toward a system and method for providing inputs and commands to an EDA tool. According to some embodiments of the invention, the systems and methods for EDA tools equip the EDA tools with command functionality that anticipates a user's (e.g., a circuit designer's) intent as the user executes commands. In this way, some embodiments of the invention provide an EDA tool with "high-altitude" layout editing capabilities, and more context-sensitive commands.

Specifically, some embodiments of the invention provide an input infrastructure for EDA tools that gathers pertinent information surrounding an input cursor's present locality (or neighborhood), and analyzes the pertinent information in view of an issued context-sensitive command to determine or predict possible decisions or operations that a user of the EDA tool may want to take next.

Figure 9:
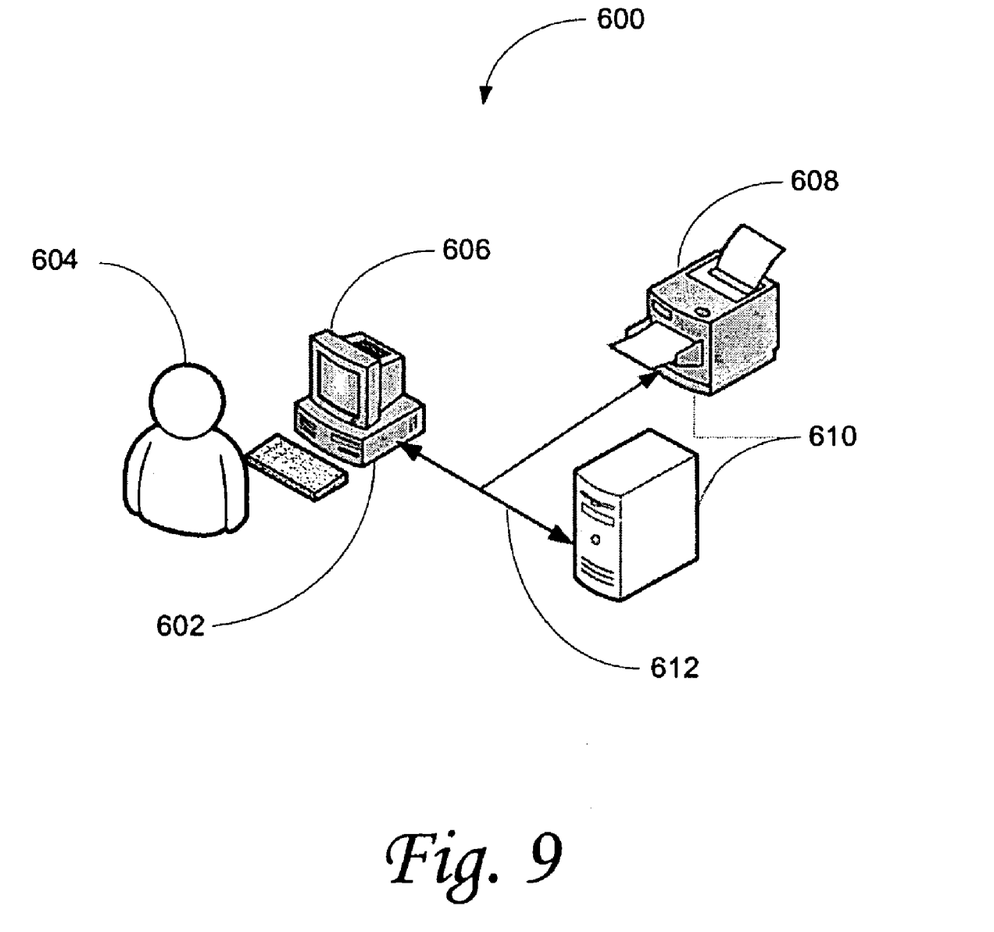
FIG. 9 is a diagram illustrating an example environment in which some embodiments of the invention can be implemented.

Before describing the invention in detail, it is useful to describe an example environment with which one embodiment of the invention can be implemented. One such example is illustrated in FIG. 9, which depicts a computer aided design system 600 that can be used by a designer 604 to design, for example, electronic circuits. System 600 can include a computer 602 and a monitor 606. The computer can be a laptop computer, desktop computer, handheld computer, mainframe computer, etc. Any computing system capable of running software implementing the systems and methods described herein can be used. Monitor 606 can be a CRT, flat screen, etc.

A circuit designer 604 can input commands into computer 602 using various peripherals such as a mouse, keyboard, track ball, etc. If computer 602 is a mainframe, designer 604 can access computer 602 using, for example, a dumb terminal. Additionally, computer 602 can be connected to a printer 608 and a server 610 using a network 612. Server 610 can, for example, be used to store additional software programs and data. In one embodiment, software implementing the systems and methods described herein can be stored on a hard drive in server 610. Thus, the software can be run from the hard drive in server 610. In another embodiment, software implementing the systems and methods described herein can be stored on a hard drive in computer 602. Thus, the software can be run from the hard drive in computer 602. Therefore, in this embodiment, the software can be used weather or not computer 602 is connected to network 612. In yet another embodiment printer 608 can be connected directly to computer 602. Thus, computer 602 can print whether or not it is connected to network 612.

Computers 602, servers 610, printers 608, and computer networks 612 are well known. Therefore, for the sake of brevity, other example environments will not be discussed. It will, however, be apparent to those of skill in the art that the systems and methods described herein can be used in conjunction with many different environments. Computer 620 can be the same as or similar to computer system 500, which is discussed below in detail with respect to FIG. 8.

From time-to-time the present invention is described herein in terms of the example environment. Description in terms of the environment is provided to allow the various features and embodiments of the invention to be portrayed in the context of an exemplary application. After reading this description, it will become apparent to one of ordinary skill in the art how the invention can be implemented in different and alternative environments.

Some embodiments of the invention provide systems and methods that achieve neighborhood awareness by utilizing an aperture or predefined area around the EDA tool's input cursor (e.g., mouse cursor). Generally, such embodiments use a user controllable aperture defined around the input cursor. Once the aperture is defined, the embodiments gather shapes, edges, and objects on the schematic canvas that lie within the boundaries of the aperture. This dataset, referred to in some embodiments as the aperture global set, is then searched for items relevant to the current command being performed and the current context in which the command is being performed. As a result, the items identified as relevant items are gathered in another dataset, referred to in some embodiments as the potential target set. From this potential target set, the command being performed gathers the most suitable targets for the next predicted operation. Often, the most suitable targets are referred to as targets that "best-fit" the immediate next target or operation for the command being performed.

Figure 1:
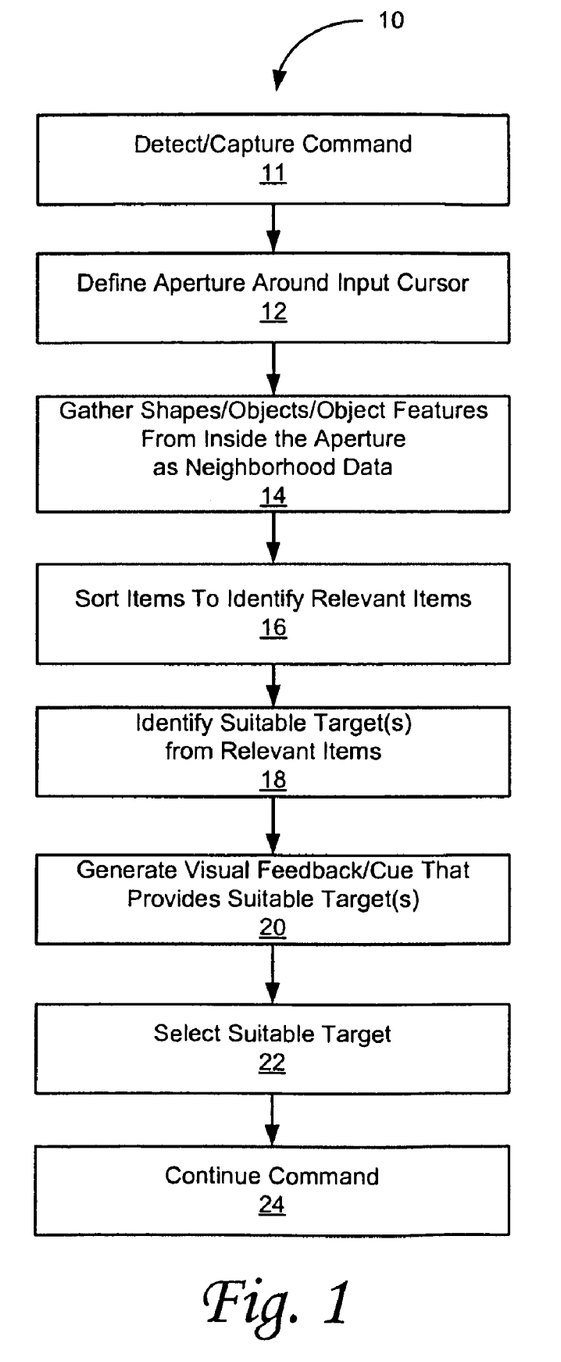
FIG. 1 is a flowchart illustrating an example method for a circuit design graphical editor in accordance with an embodiment of the systems and methods described herein.

FIG. 1 is a flowchart illustrating an example method 10 in accordance with one embodiment of systems and methods described herein. Specifically, by achieving neighborhood awareness, method 10 provides commands within an EDA tool with anticipative and intelligent command capabilities. Through these command capabilities, the EDA tool is capable of command intelligence for the graphical editor, high-altitude editing of circuit designs, and increased context sensitivity. Method 10 provides context sensitivity to traditionally non-context-sensitive commands, as well as increased context sensitivity to commands already known to be context-sensitive.

Beginning at operation 11, method 10 captures or detects a command issued through an EDA tool. The command then defines the aperture in operation 12, wherein the aperture is defined around the input cursor (e.g. mouse cursor). In various instances of the invention, the aperture is user-controllable. At operation 12, method 10 gathers from within the aperture, items such as shapes, objects, and object features, as neighborhood data. Depending on the embodiment, the items gathered can be either all of the items within the aperture, only the items within the aperture relevant to the current command, or only items within the aperture predetermined by the user (e.g., the circuit designer). In addition, some embodiments of the invention gather the neighborhood data as a dataset referred to as the aperture global set.

At operation 16, method 10 traverses the neighborhood data and sorts the data to identify relevant items. In determining and sorting what is relevant, the operation analyzes the command currently being performed and the current context in which the command is being performed. For example, a row may not be relevant when a circuit designer is trying to label a bus and, therefore, would be dropped during the operation 16 if detected inside an aperture. As another example, during execution of a command, when the aperture is nearing a conic shape, the operation 16 would focus on conic-specific items as relevant.

At operation 18, based upon the relevant items identified during operation 16, method 10 identifies one or more suitable targets for the command currently being performed. Various embodiments take into account considerations such as layout topology, past inputs since command start, and input cursor awareness (e.g. mouse motion), when identifying the suitable target or targets. Once the method 10 determined or identified a set of targets, it generates visual feedback/visual cues at operation 20 to present the set of targets to the circuit designer. In instances where only one suitable target is present within the set, the method 10 prompts the circuit designer at operation 22 on whether to proceed with the single suitable target. However, in instances where the set contains more than one suitable target, at operation 22 the system allows the circuit designer to toggle (i.e. cycles) through the selection of suitable targets to select one. In some embodiments, the circuit designer uses input hotkeys to cycle through the possible choice of targets. Upon selection, the method 10 continues with the command performance at operation 24. A target for a command can include an object or a feature of an object upon which a command can operate. Such targets can include path ends, path centerlines, vertices, midpoints, nexuses of objects, the edge of objects. These target examples are discussed below with respect to FIG. 5.

Figure 2:
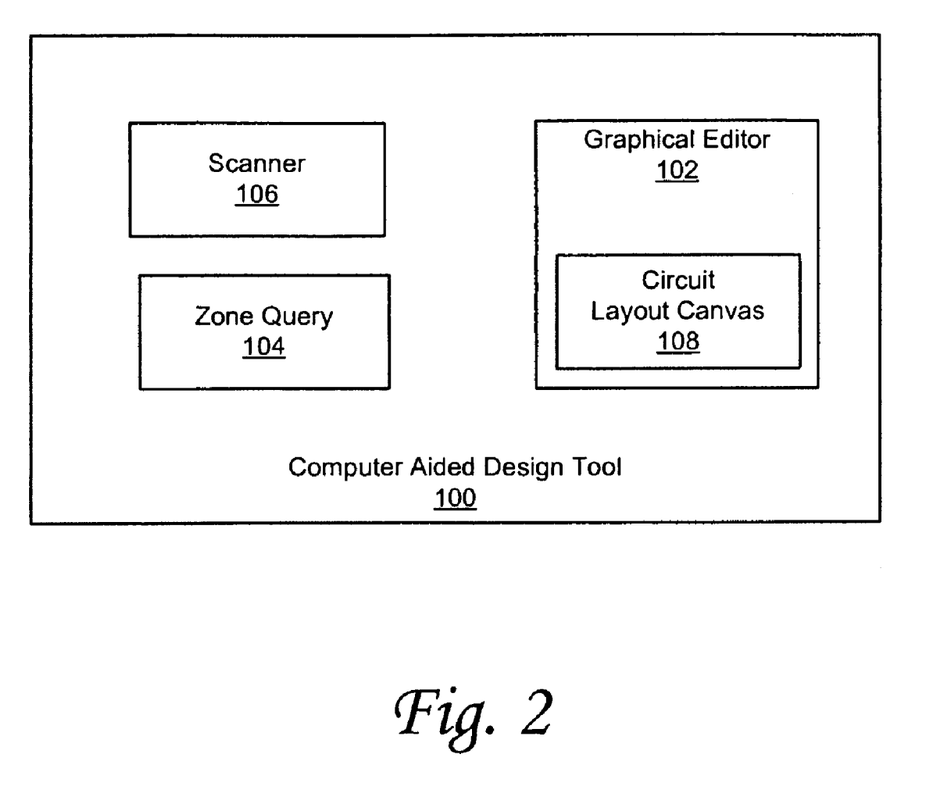
FIG. 2 is a diagram illustrating an example system in accordance with one embodiment of the invention.

FIG. 2 is a diagram illustrating an example computer aided design tool 100 in accordance with one embodiment of the invention. This example computer design tool 100 includes, but is not limited to, a circuit design integrated design environment ("IDE"). As previously mentioned, a circuit design IDE is a type of EDA tool. The example tool 100 comprises a graphical editor component 102, a zone query component 104, a scanner component 106, and a circuit layout canvas component 108 (also referred to as "schematic canvas").

The graphical editor component 102 is a module of the computer aided design tool 100 configured to visualize circuit designs and to provide a circuit designer with a graphical user interface ("GUI") by which commands can be inputted. The graphical user interface can include an input cursor (such as, for example, a mouse cursor) by which the circuit designer can graphically input commands to the design tool 100. The layout canvas 108 is the component of the graphical editor 102 configured to display the circuit design and to accept selections made to a circuit design displayed within the canvas 108.

The zone query component 104 is a module configured to retrieve pertinent information from a circuit design currently being displayed in the canvas component 108. In particular, zone query component 104 is capable of retrieving information from specific regions (or "zones") of a circuit design. Such pertinent information includes, for example, objects and object features that exist in a given region of a circuit design. With respect to objects, some examples can include various shapes and polygons. With regard to object features, some examples include, but are not limited to, the edges, vertices, midpoints, pins, nexuses, and centerlines.

Using the zone query component 104, tool 100 is configured to gathering pertinent data local to the region surrounding an input cursor's current position. This local data, also referred to as neighborhood data, is gathered by the scanner component 106, which uses the neighborhood data, in conjunction with the issued context-sensitive command to determine a suggested next target or operation. Optionally, scanner 106 can also further consider process rules and process rule overrides when determining the suggested next target or operation.

For the example where a context-sensitive command is being applied to the edges of objects, zone query 104 would provided scanner 106 with all the edges on the circuit layout canvas 108 closest to the current location of the mouse cursor. With this pertinent "edge" information, scanner 106 can provide the circuit design user with a list of all the edges closest to the current location of the mouse cursor or, in the alternative, highlight the closest edge for the user to decide the next target or operation.

In some instances, once the scanner 106 determines a suggested next target or operation, the suggested next target or operation is displayed as a visual cue in the graphical editor component 102. Visual cues, in some instances, may comprise a visual indication on the graphical editor of the suggested next target or operation. For example, tool 100 can, as a suggested next target or operation, highlight an edge displayed in canvas 108 as the potential target for the context-sensitive command currently being performed.

Also, in order to speed up information gathering, the scanner component 106 or, alternatively, the zone query component 104, can cache neighborhood data as it is gathered.

Figure 3:
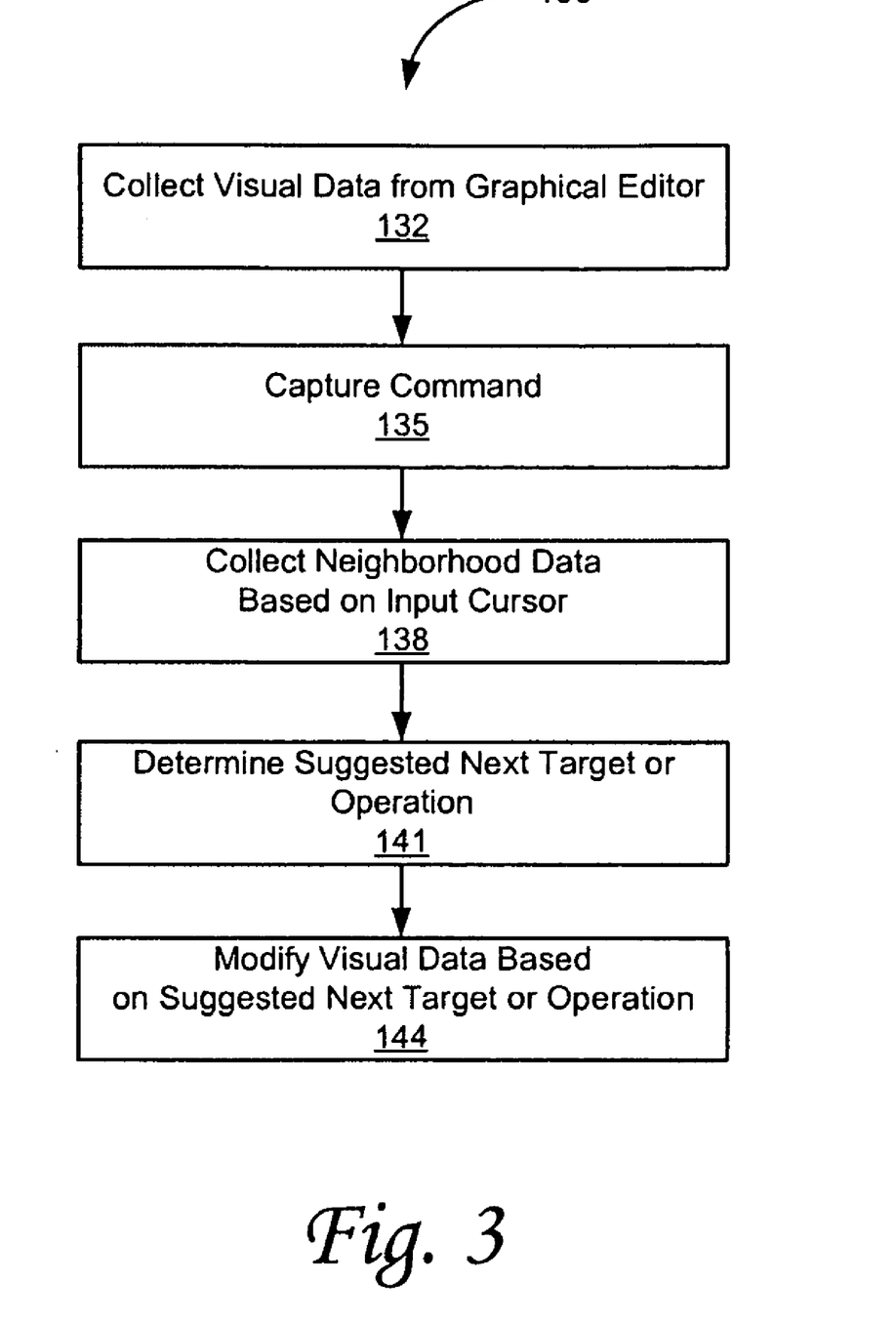
FIG. 3 is a flowchart illustrating an example method for a circuit design graphical editor in accordance with one embodiment of the systems and methods described herein.

FIG. 3 is a flowchart illustrating an example method 130 for a circuit design graphical editor in accordance with one embodiment of the systems and methods described herein. The method 130 begins at operation 132 by collecting visual data from the graphical editor. In some embodiments, the graphical editor of method 130 is similar to that of graphical editor component 102 described in FIG. 2. Similar to component 102, the graphical editor handles circuit design visualization and command inputs. The visual data comprises a visual representation of what is currently being displayed in the graphical editor, which includes the circuit layout design and the input cursor for the graphical editor.

Next, at operation 135 the method 130 captures the command issued through the graphical editor. As previously noted, context-sensitive commands are those commands that base their operation on the context in which it is issued. In this particular instance, the context includes the content being displayed in the graphical editor when the context-sensitive command is issued. Examples of context-sensitive commands include, for example, ruler commands, bus commands, create commands, move commands, copy commands, paste commands, stretch commands, and align commands. A person of ordinary skill would appreciate that create commands cover any command that creates any form of object on the schematic canvas. Such objects include, but are not limited to, a wire, a rectangle, and a conic.

At operation 138, the method 130 collects neighborhood data based on the present location of the input cursor in the graphical editor. The neighborhood data provides the context information needed for the context-sensitive command to make its next target or operation. In this example method, the neighborhood data comprises pertinent information gathered from the region of the circuit design presently surrounding the input cursor.

Subsequently, operation 141 determines the suggested next target or operation based on the issued context-sensitive command and the collected neighborhood data. Upon determination, the method 130 is able to modify the visual data based on the suggested next target or operation at operation 144. As previously noted with respect to FIG. 2, the suggested next target or operation can be displayed as a visual cue, preferably through the graphical editor. In some embodiments, the visual cue comprises a visual indication of the context-sensitive command's currently intended target (also known as the selected target). In yet other embodiments, the suggested next target or operation can be displayed as a preview of the outcome of the suggested next target or operation, before the suggested next target or operation is actually chosen and performed. For example, for a move command, once a circuit object has been selected in the graphical editor, an embodiment of the invention can ghost an image of the object at potential, viable locations.

Figure 4:
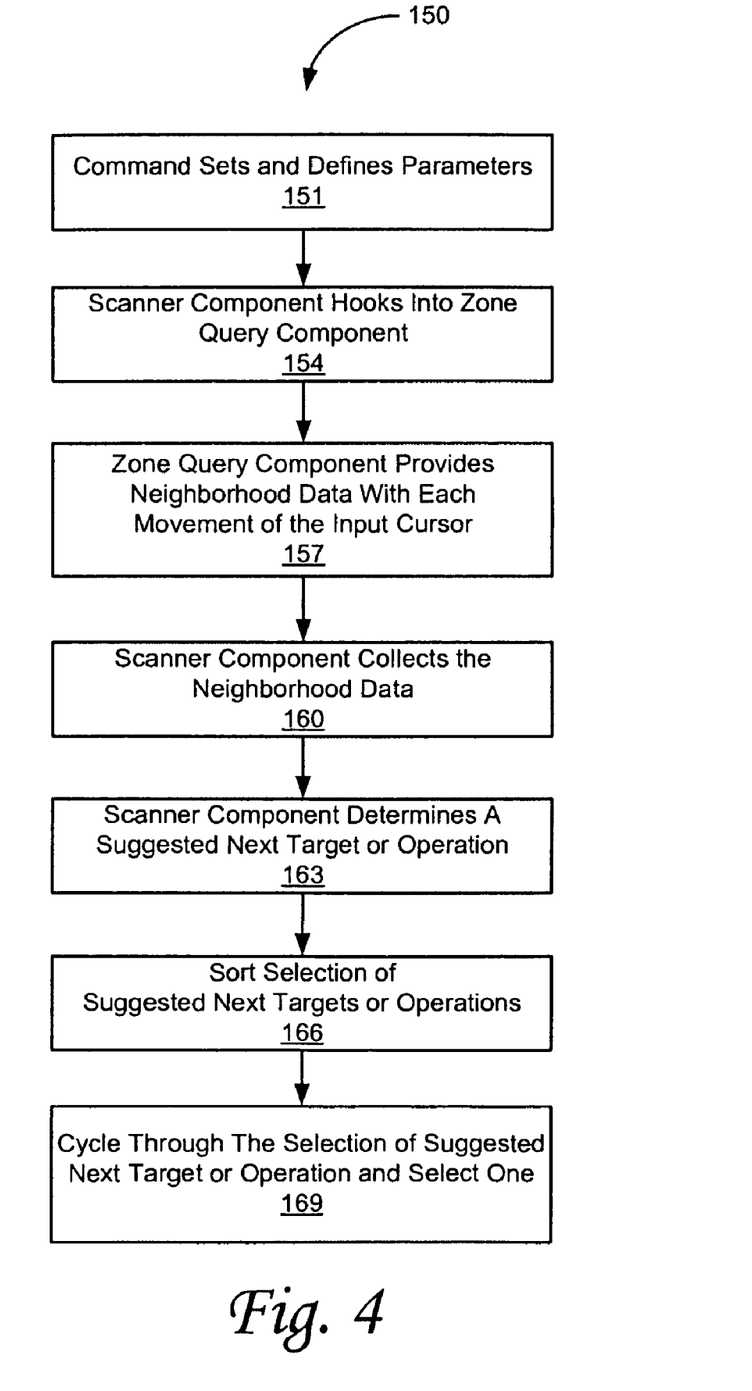
FIG. 4 is a flowchart illustrating an example method for a circuit design graphical editor in accordance with an embodiment of the systems and methods described herein.

FIG. 4 is a flowchart illustrating an example method 150 for a circuit design graphical editor in accordance with an embodiment of the systems and methods described herein. Specifically, FIG. 4 illustrates the operation of the computer aided design tool illustrated in FIG. 2 in accordance with one embodiment of the invention. Method 150 starts at operation 151 with the currently performed command defining parameters for the scanner component. Through these parameters, the scanner component 106 is configured to filter the neighborhood data for information relevant to the command. The configured scanner component 106 connects to the query component 104 at operation 154. The query component 104, in turn, provides the scanner component 106 with neighborhood data, at operation 157. With some embodiments, the new neighborhood data is provided upon movement of the input cursor (e.g. mouse cursor). In other embodiments, the rate and conditions under which a zone query component provides new neighborhood data to a scanner component may vary.

At operation 160, the scanner component 106 then collects the neighborhood data provided by the zone query component 104. In some embodiments, the neighborhood data may be cached as it is collected, to speed future retrievals. Using the collected neighborhood data, the scanner component 106 is able to determine a suggested next target or operation. In some embodiments, scanner component 106 determines a suggested next target or operation in view of the known functionalities and characteristics of the command presently being performed. In this way, method 150 anticipates the next target or operation the circuit designer may want to perform. In various embodiments, the suggested next target or operation comprises determining a possible target on which the command can perform. For some embodiments, upon determining a possible target, the circuit designer is prompted by the command before proceeding.

However, in some instances, method 150 determines a number of possible targets for the command. In such instances, the method 150 sorts through the selection of suggested next targets or operations at operation 166 and then presents the possible targets to the circuit designer, possibly through visual cues. The circuit designer, in turn, is able to cycle through the selections of suggested next target or operation and select one, at operation 169.

Figure 5:
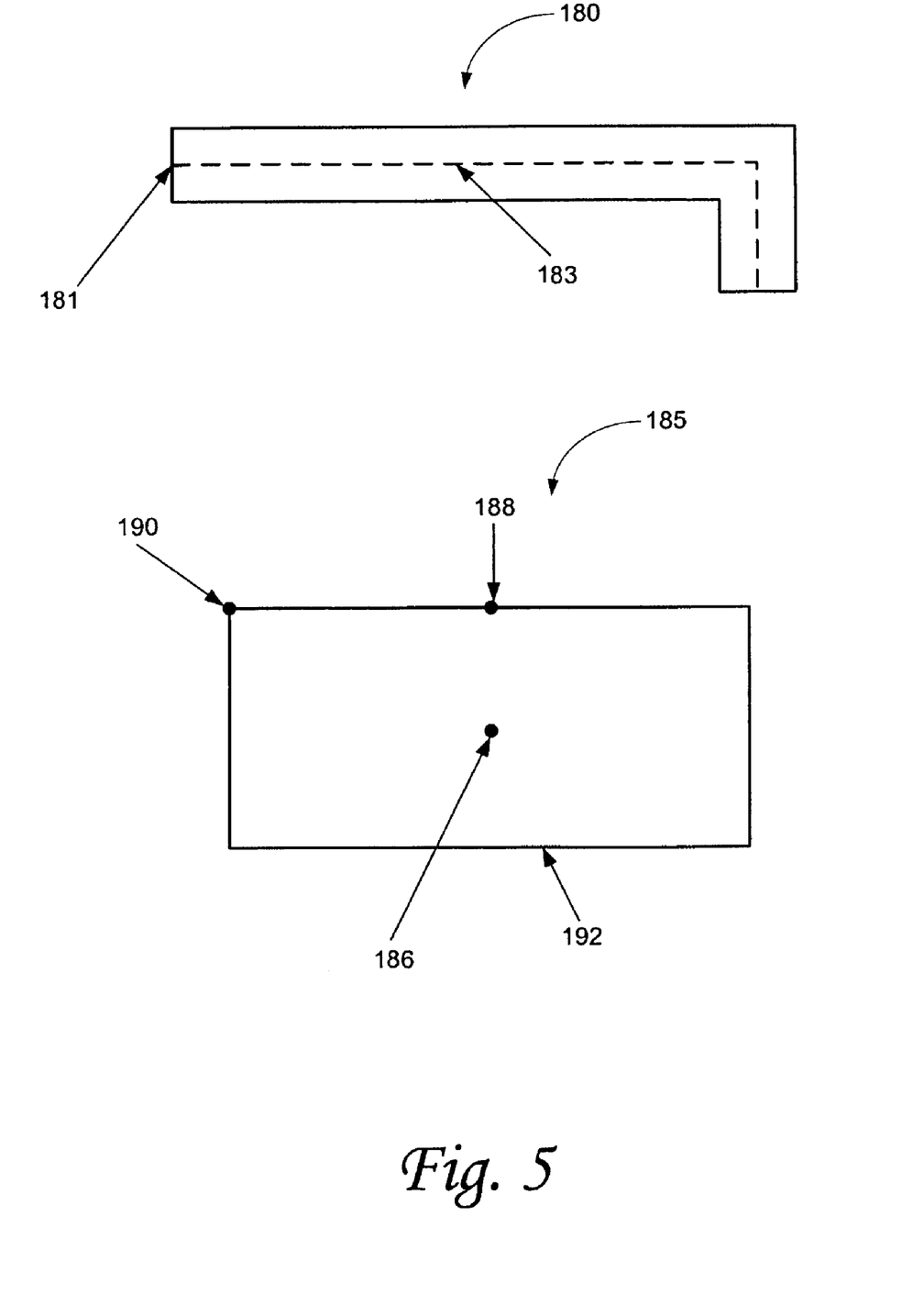
FIG. 5 is a diagram of example object features in accordance with one embodiment of the systems and methods described herein.

FIG. 5 is a diagram illustrating example object features in accordance with one embodiment of the systems and methods described herein. In some embodiments, these example objects and object features are targets for commands executed within an EDA in accordance with this invention. Depicted on path 180 are a path end 181 and a path centerline 183. Also depicted is rectangle object 185, which includes a vertex 190, midpoint 188, nexus of the rectangle 186 (i.e. center of rectangle), and edge 192. As will become apparent to those skilled in the art after reading this description, other targets for commands can be realized.

Figure 6:
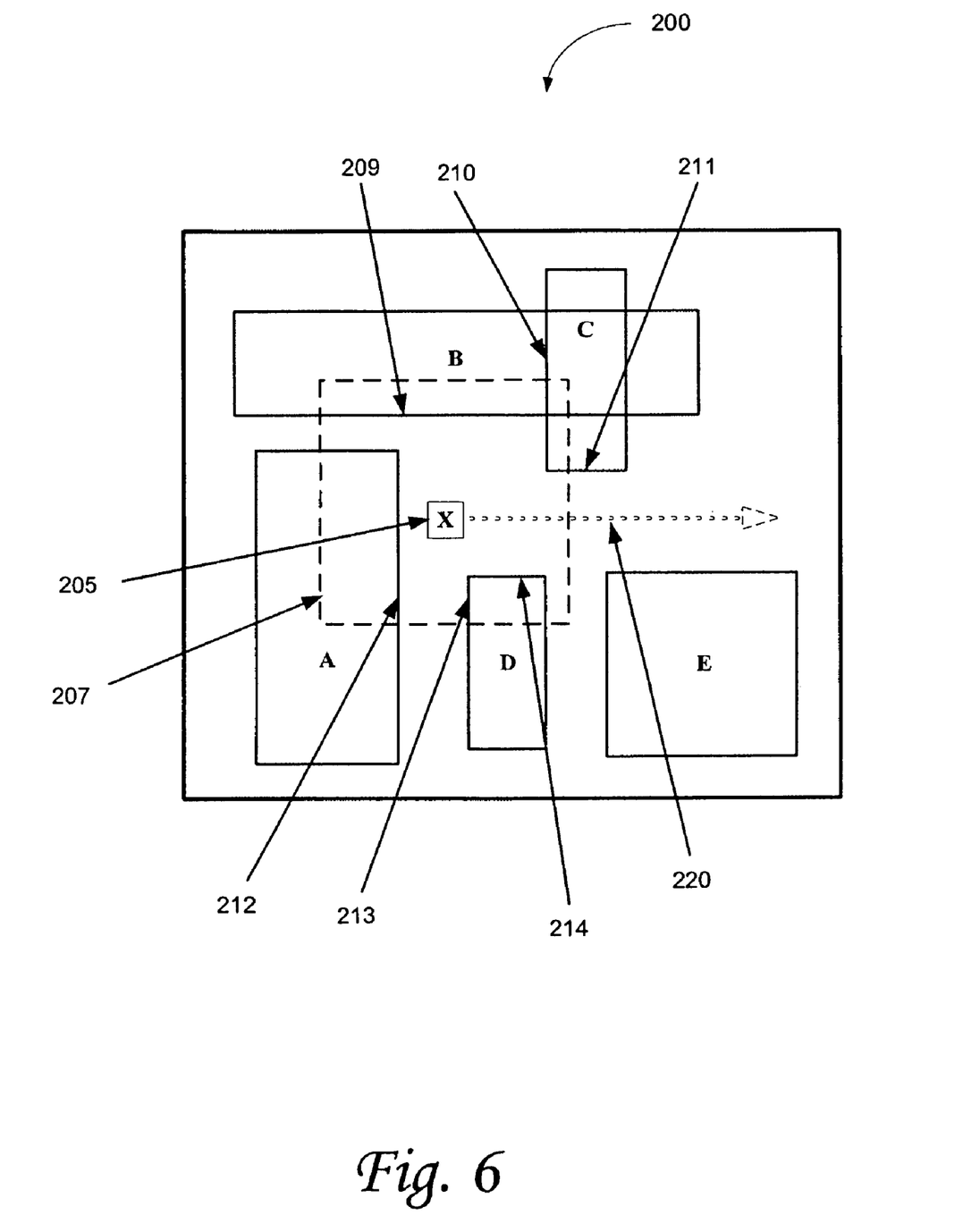
FIG. 6 is a diagram illustrating an example screen shot of a smart ruler command in operation in accordance with one embodiment of the systems and methods described herein.

FIG. 6 is a diagram illustrating an example screen shot 200 of a smart ruler command in operation in accordance with one embodiment of the invention. Now referring to screen shot 200, the screen shot illustrate a user starting a rule command by clicking at an intended start point "X" at location 205. Based on location 205, an aperture 207 is automatically defined in accordance with the invention. Because blocks A, B, C, and D, and their related edges fall within aperture 207, the current neighbor information (i.e. aperture global set) is populated with those elements (e.g. shapes and edges). Those in the art would appreciate that all shapes and edges are typically relevant to a ruler command.

Once all the elements inside the aperture are collected as neighborhood information (i.e. within the aperture global set), the ruler command determines which elements are relevant to the command and places them into the potential target set. Note, the relevancy of elements changes from command to command. Usually for the ruler command, the relevant element type is dependent on the ruler command's mode of operation (i.e. edge (E), center-line (C), or vertex (V) mode).

Because the ruler command in screen shot 200 is in edge mode, edges 209-214 are identified as suitable/potential edges that could serve as a "best fit" (suitable or appropriate) target edge for the rule command. Once the user clicks at location 205, the ruler command can determine the "best fit" target edge or edges for the ruler. Here, the command determines edges 209-214 of blocks A, B, C, and D to be the "best because those edges either partially or entirely fall within aperture 207. In addition, because there is more than one potential target edge, each edge (209-214) is presented to the user as a potential target edge based on an order of relevance. In this example, the proximity of the edge to click location 205 and the selected direction 220 of the input cursor after the click aids in the determination of that order of relevance.

For example, if the user were to click at location 205 and then drag the input cursor in selected direction 220, edge 214 would be in one embodiment considered the "best fit" target edge for the ruler command. As such, edge 214 would either be presented to the user as the "best fit" target edge or the ruler command could automatically snap from location 205 to edge 214. Optionally, if edge 214 is not the user's desired target edge, the user can cycle through the remaining potential target edges (i.e. edges 209-213) to find a desired target edge. The criteria for order of relevance or precedence can be different from command to command.

Figure 7:
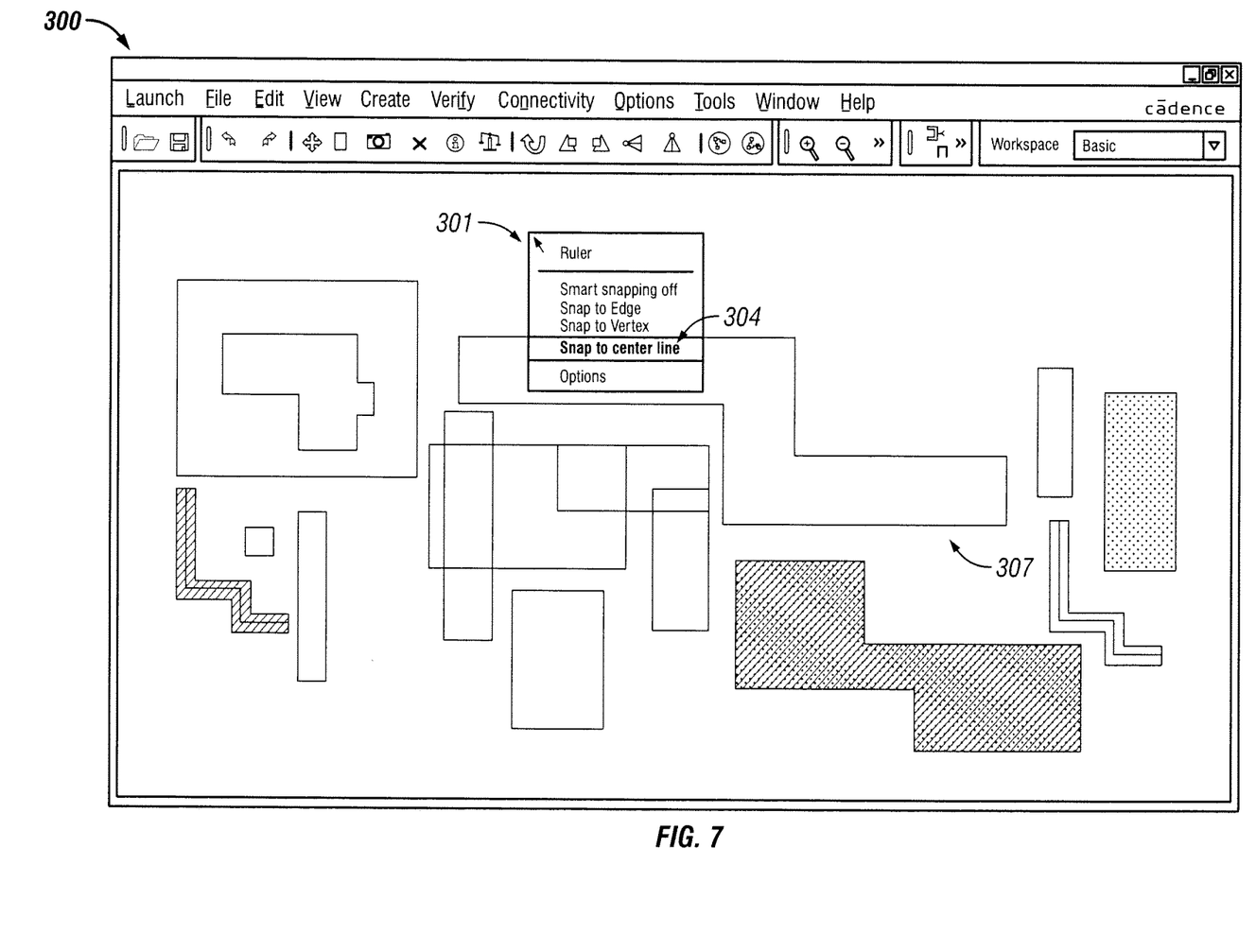
FIG. 7 is a picture of an example graphical user interface in accordance with one embodiment of the systems and methods described herein.

FIG. 7 is a picture of an example graphical user interface 300 in accordance with one embodiment of the systems and methods described herein. Specifically, FIG. 7 shows the graphical user interface 300 of a graphical editor in accordance with one embodiment of the invention. Mouse cursor 301 is an example of an input cursor in accordance with the invention, context menu 304 is an example of a visual cue that can be provided by the graphical editor in accordance with the invention, and canvas 307 is an example of the circuit layout canvas 108 previously described with respect to FIG. 2.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 8:
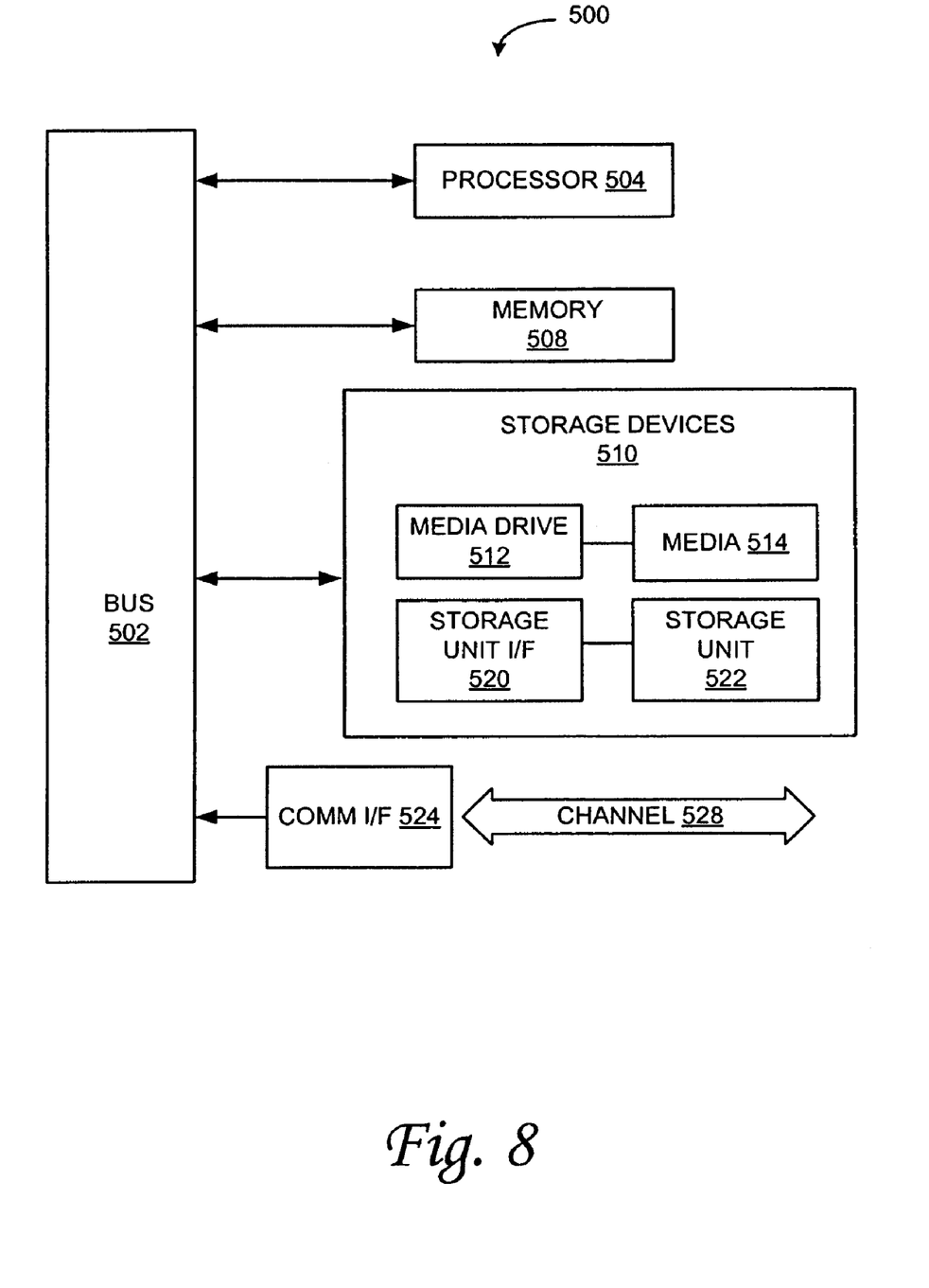
FIG. 8 is a diagram illustrating a computer system that can be used in conjunction with some embodiments of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 8. Various embodiments are described in terms of this example-computing module 500. After reading this description, it will become apparent to a person skilled in the relevant art how to implement the invention using other computing modules or architectures.

Referring now to FIG. 8, computing module 500 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 500 might also represent computing capabilities embedded within or otherwise available to a given device. For example, a computing module might be found in other electronic devices. Computing module 500 might include, for example, one or more processors or processing devices, such as a processor 504. Processor 504 might be implemented using a general-purpose or special-purpose processing engine such as, for example, a microprocessor, controller, or other control logic.

Computing module 500 might also include one or more memory modules, referred to as main memory 508. For example, random access memory (RAM) or other dynamic memory might be used for storing information and instructions to be executed by processor 504. Main memory 508 might also be used for storing temporary variables or other intermediate information during execution of instructions by processor 504. Computing module 500 might likewise include a read only memory ("ROM") or other static storage device coupled to bus 502 for storing static information and instructions for processor 504.

The computing module 500 might also include one or more various forms of information storage mechanism 510, which might include, for example, a media drive 512 and a storage unit interface 520. The media drive 512 might include a drive or other mechanism to support fixed or removable storage media 514. For example, a hard disk drive, a floppy disk drive, a magnetic tape drive, an optical disk drive, a CD or DVD drive (R or RW), or other removable or fixed media drive. Accordingly, storage media 514 might include, for example, a hard disk, a floppy disk, magnetic tape, cartridge, optical disk, a CD or DVD, or other fixed or removable medium that is read by, written to or accessed by media drive 512. As these examples illustrate, the storage media 514 can include a computer usable storage medium having stored therein particular computer software or data.

In alternative embodiments, information storage mechanism 510 might include other similar instrumentalities for allowing computer programs or other instructions or data to be loaded into computing module 500. Such instrumentalities might include, for example, a fixed or removable storage unit 522 and an interface 520. Examples of such storage units 522 and interfaces 520 can include a program cartridge and cartridge interface, a removable memory (for example, a flash memory or other removable memory module) and memory slot, a PCMCIA slot and card, and other fixed or removable storage units 522 and interfaces 520 that allow software and data to be transferred from the storage unit 522 to computing module 500.

Computing module 500 might also include a communications interface 524. Communications interface 524 might be used to allow software and data to be transferred between computing module 500 and external devices. Examples of communications interface 524 might include a modem or softmodem, a network interface (such as an Ethernet, network interface card, WiMAX, 802.XX or other interface), a communications port (such as for example, a USB port, IR port, RS232 port, Bluetooth interface, or other port), or other communications interface. Software and data transferred via communications interface 524 might typically be carried on signals, which can be electronic, electromagnetic, optical or other signals capable of being exchanged by a given communications interface 524. These signals might be provided to communications interface 524 via a channel 528. This channel 528 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to storage media such as, for example, memory 508, storage unit 520, and media 514. These and other various forms of computer program media or computer usable media may be involved in providing one or more sequences of one or more instructions to a processing device for execution. When executed, such instructions might enable the computing module 500 to perform features or functions of the present invention as discussed herein.

While various embodiments of the present invention have been described above, it should be understood that they have been presented by way of example only, and not of limitation. The breadth and scope of the present invention should not be limited by any of the above-described exemplary embodiments. Where this document refers to technologies that would be apparent or known to one of ordinary skill in the art, such technologies encompass those apparent or known to the skilled artisan now or at any time in the future. In addition, the invention is not restricted to the illustrated example architectures or configurations, but the desired features can be implemented using a variety of alternative architectures and configurations. As will become apparent to one of ordinary skill in the art after reading this document, the illustrated embodiments and their various alternatives can be implemented without confinement to the illustrated example. One of ordinary skill in the art would also understand how alternative functional, logical or physical partitioning and configurations could be utilized to implement the desired features of the present invention.

Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A method for a circuit design graphical editor, comprising:
   detecting an executed command in the circuit design graphical editor;
   defining an aperture around an in cursor, wherein the aperture is a predefined area centered around the input cursor;
   collecting a neighborhood dataset from objects or object features within the aperture, wherein the objects and object features are elements of a circuit layout design, and the neighborhood dataset comprises information regarding the objects or object features within the aperture;
   selecting one or more potential targets from the objects or object features of the circuit layout design based on the neighborhood dataset, wherein the potential targets are suitable for the executed command to operate upon; and
   using a computing device to present the potential targets through a visual feedback.

2. The method of claim 1, wherein the objects and object features of the circuit layout design include shapes, edges, vertices, midpoints, object ends, nexuses and centerlines.

3. The method of claim 1, further comprising sorting the potential targets according to a precedence and order based on relevancy to the executed command.

4. The method of claim 1, wherein collecting the neighborhood data is based on relevancy to the executed command.

5. The method of claim 1, wherein selecting the potential targets is further based on a circuit layout topology.

6. The method of claim 1, wherein selecting the potential targets is further based on one or more inputs made since invoking the executed command.

7. The method of claim 1, wherein selecting the potential targets is further based on a position and movement of the input cursor.

8. The method of claim 1, wherein presenting the potential targets further comprises presenting a single potential target at a time.

9. The method of claim 1, wherein the input cursor includes a mouse cursor.

10. A computer program product for a circuit design a graphical editor comprising a computer useable medium having computer program code embodied therein for enabling a computing device to perform the operations of:
    detecting an executed command in the circuit design graphical editor;
    defining an aperture around an input cursor, wherein the aperture is a predefined area centered around the input cursor;
    collecting a neighborhood dataset from objects or object features within the aperture, wherein the objects and object features are elements of a circuit layout design, and the neighborhood dataset comprises information regarding the objects or object features within the aperture;
    selecting one or more potential targets from the objects or object features of the circuit layout design based on the neighborhood dataset, wherein the potential targets are suitable for the executed command to operate upon; and
    presenting the potential targets through a visual feedback.

11. The computer program product of claim 10, wherein the objects and object features of the circuit layout design include shapes, edges, vertices, midpoints, object ends, nexuses and centerlines.

12. The computer program product of claim 10, the computer program further enabling the computing device to perform the operation of sorting the potential targets according to a precedence and order based on relevancy to the executed command.

13. The computer program product of claim 10, wherein collecting the neighborhood data is based on relevancy to the executed command.

14. The computer program product of claim 10, wherein selecting the potential targets is further based on a circuit layout topology.

15. The computer program product of claim 10, wherein selecting the potential targets is further based on one or more inputs made since invoking the executed command.

16. The computer program product of claim 10, wherein selecting the potential targets is further based on a position and movement of the input cursor.

17. The computer program product of claim 10, wherein presenting the potential targets further comprises presenting a single potential target at a time.

18. The computer program product of claim 10, wherein the input cursor includes a mouse cursor.

19. A computer aided circuit design tool, comprising:
    a processor; and
    a memory, coupled to the processor and having computer program code embodied therein for enabling the processor to perform the operations of:
    detecting an executed command in the computer aided circuit design tool;
    defining an aperture around an input cursor, wherein the aperture is a predefined area centered around the input cursor;
    collecting a neighborhood dataset from objects or object features within the aperture, wherein the objects and object features are elements of a circuit layout design, and the neighborhood dataset comprises information regarding the objects or object features within the aperture;
    selecting one or more potential targets from the objects or object features of the circuit layout design based on the neighborhood dataset, wherein the potential targets are suitable for the executed command to operate upon; and
    presenting the potential targets through a visual feedback.

20. The computer aided design tool of claim 19, wherein the objects and object features of the circuit layout design include shapes, edges, vertices, midpoints, object ends, nexuses and centerlines.

21. The computer aided design tool of claim 19, the computer program further enabling the computing device to perform the operation of sorting the potential targets according to a precedence and order for the neighborhood dataset based on relevancy to the executed command.

22. The computer aided design tool of claim 19, wherein collecting the neighborhood data is based on relevancy to the executed command.

23. The computer aided design tool of claim 19, wherein selecting the potential targets is further based on a circuit layout topology.

24. The computer aided design tool of claim 19, wherein selecting the potential targets is further based on one or more inputs made since invoking the executed command.

25. The computer aided design tool of claim 19, wherein determining the potential targets is further based on a position and movement of the input cursor.

26. The computer aided design tool of claim 19, wherein presenting the potential targets further comprises presenting a single potential target at a time.

27. The computer aided design too of claim 9, wherein the input cursor includes a mouse cursor.

28. A method for a circuit design graphical editor, comprising:
    collecting a visual dataset from the circuit graphical editor, wherein the visual dataset comprises a visual representation of a circuit layout design;
    capturing a command issued through the circuit graphical editor;
    collecting a neighborhood dataset from the visual dataset and an input cursor dataset,
    wherein the neighborhood dataset comprises information regarding objects or objects features of the circuit layout design and the input cursor dataset comprises a position and movement of an input cursor of the graphics editor;
    determining a suggested next target or operation based on the command dataset and the neighborhood dataset; and
    using a computer device to modify the visual dataset such that the visual representation displays the circuit layout design in view of the suggested next target or operation.

29. The method of claim 28, wherein the suggested next target or operation is displayed as a visual cue.

30. The method of claim 28, wherein the suggested next target or operation provides a possible target based on the possible target's proximity to the input cursor.

31. The method of claim 30, wherein the possible target includes an object and an object feature of the circuit layout design.

32. The method of claim 30, wherein a command to cycle through a plurality of possible targets is provided when more than one possible target is provided.

33. The method of claim 32, wherein a selected target the plurality of possible targets is highlighted as the command to cycle is issued.

34. The method of claim 32, wherein the plurality of possible targets is sorted based on neighborhood dataset, the command dataset, or both the neighborhood dataset and the command dataset.

35. The method of claim 28, wherein modifying the visual dataset results in the visual representation displaying a preview of the suggested next target or operation.

36. The method of claim 28, wherein the neighborhood dataset comprises data regarding the objects or object features in proximity to the input cursor.

37. The method of claim 36, wherein the objects and object features include an edge, a vertex, a midpoint, an end, a nexus or a centerline.

38. The method of claim 28, wherein the neighborhood dataset is cached.

39. The method of claim 28, wherein the input cursor is a mouse cursor.

40. The method of claim 28, wherein determining the suggested next target or operation is further based on a process rule or a process rule override.

* * * * *

UNITED STATES PATENT AND TRADEMARK OFFICE
CERTIFICATE OF CORRECTION

| | | |
|---|---|---|
| PATENT NO. | : 8,271,909 B2 | Page 1 of 1 |
| APPLICATION NO. | : 12/366911 | |
| DATED | : September 18, 2012 | |
| INVENTOR(S) | : Chayan Majumder et al. | |

It is certified that error appears in the above-identified patent and that said Letters Patent is hereby corrected as shown below:

Col. 13, line 26, delete "in" and insert --input--.

Col. 13, line 62, delete "a" (second occurrence).

Col. 15, line 18, delete "too" and insert --tool-- and delete "9" and insert --19--.

Signed and Sealed this
Sixth Day of November, 2012

David J. Kappos
*Director of the United States Patent and Trademark Office*